US012774514B2

(12) United States Patent
Eriksson

(10) Patent No.: US 12,774,514 B2
(45) Date of Patent: Oct. 27, 2026

(54) COATING SYSTEM FOR PLASTIC PROCESSING APPLICATIONS

(71) Applicant: OERLIKON SURFACE SOLUTIONS AG, PFÄFFIKON, Pfäffikon (CH)

(72) Inventor: Anders Olof Eriksson, Chur (CH)

(73) Assignee: OERLIKON SURFACE SOLUTIONS AG, PFÄFFIKON, Pfäffikon (CH)

(*) Notice: Subject to any disclaimer, the term of this patent is extended or adjusted under 35 U.S.C. 154(b) by 441 days.

(21) Appl. No.: 18/278,443

(22) PCT Filed: Feb. 23, 2022

(86) PCT No.: PCT/EP2022/054519
§ 371 (c)(1),
(2) Date: Aug. 23, 2023

(87) PCT Pub. No.: WO2022/180093
PCT Pub. Date: Sep. 1, 2022

(65) Prior Publication Data

US 2024/0052482 A1 Feb. 15, 2024

(30) Foreign Application Priority Data

Feb. 23, 2021 (DE) .................... 10 2021 000 958.4

(51) Int. Cl.
*C23C 14/06* (2006.01)
*C23C 14/54* (2006.01)
(Continued)

(52) U.S. Cl.
CPC ...... *C23C 14/0641* (2013.01); *C23C 14/0676* (2013.01); *C23C 14/542* (2013.01);
(Continued)

(58) Field of Classification Search
CPC ............ C23C 14/0617; C23C 14/0641; C23C 14/0647; C23C 14/0652; C23C 14/0658;
(Continued)

(56) References Cited

U.S. PATENT DOCUMENTS 10,174,416 B2 1/2019 Ramm
2007/0269610 A1* 11/2007 Fukui ................. C23C 14/0641 427/497

(Continued)

FOREIGN PATENT DOCUMENTS

CN 105143498 A 12/2015
CN 206828625 U 1/2018

(Continued)

OTHER PUBLICATIONS

Machine translation of CN 108950548 A.*

(Continued)

*Primary Examiner* — Z. Jim Yang
(74) *Attorney, Agent, or Firm* — Fleit Intellectual Property Law; Paul D. Bianco

(57) ABSTRACT

A multilayer coating exhibits good corrosion resistance and good abrasion resistance. The multilayer coating includes layers A and layers B deposited forming a sequence of the type . . . A/B/A/B/A . . . , with the layers A being CrN-based layers or CrN layers and the layers B being CrON-based layers or CrON layers. The multilayer coating exhibits a modulated ratio of the thicknesses of the A layers and B layers, in a manner that the multilayer coating comprises at least two different coating portions along the whole multilayer coating thickness, with differently adjusted ratio of the thicknesses of the A layers and B layers.

4 Claims, 4 Drawing Sheets

(51) Int. Cl.
*C23C 30/00* (2006.01)
*B29C 33/56* (2006.01)
*B29C 48/30* (2019.01)

(52) U.S. Cl.
CPC ............ *C23C 30/005* (2013.01); *B29C 33/56* (2013.01); *B29C 48/3003* (2019.02)

(58) Field of Classification Search
CPC ............ C23C 14/0664; C23C 14/0676; C23C 14/081; C23C 14/083; C23C 16/301; C23C 16/303; C23C 16/308; C23C 16/34–36; C23C 16/40; C23C 16/403; C23C 16/405; C23C 30/005; C23C 28/04–44; C04B 41/52; C04B 41/522; C04B 41/524; C04B 41/526; C04B 41/89
See application file for complete search history.

(56) References Cited

U.S. PATENT DOCUMENTS

| | | | | |
|---|---|---|---|---|
| 2008/0193782 | A1* | 8/2008 | Ramm | H01J 37/32055 427/576 |
| 2008/0318062 | A1* | 12/2008 | Endrino | C23C 14/0664 428/428 |
| 2009/0120241 | A1* | 5/2009 | Vetter | C23C 14/025 407/30 |
| 2010/0047545 | A1* | 2/2010 | Yamamoto | C23C 14/06 428/220 |
| 2010/0081000 | A1* | 4/2010 | Vetter | C23C 14/024 204/192.16 |
| 2011/0033722 | A1* | 2/2011 | Minami | B23D 61/00 428/553 |
| 2015/0273724 | A1* | 10/2015 | Minami | B23D 61/028 428/141 |
| 2016/0060746 | A1 | 3/2016 | Ramm | |
| 2017/0029931 | A1* | 2/2017 | Hirano | C23C 14/06 |
| 2017/0129818 | A1* | 5/2017 | Nii | C23C 28/42 |
| 2017/0167009 | A1* | 6/2017 | Smith | C23C 28/042 |
| 2018/0071829 | A1* | 3/2018 | Hirano | C23C 28/042 |
| 2018/0237922 | A1* | 8/2018 | Khatibi | C23C 14/3492 |
| 2018/0371608 | A1* | 12/2018 | Moriguchi | C23C 28/044 |
| 2019/0040519 | A1* | 2/2019 | Sato | C23C 28/42 |
| 2019/0093768 | A1* | 3/2019 | Lima Sarabanda | C23C 14/0641 |
| 2019/0247930 | A1* | 8/2019 | Tanaka | C23C 14/0641 |
| 2020/0224319 | A1 | 7/2020 | Zou | |
| 2020/0299823 | A1* | 9/2020 | Raab | C23C 14/0641 |
| 2021/0285109 | A1* | 9/2021 | Kohlscheen | C23C 14/0676 |
| 2022/0032357 | A1* | 2/2022 | Shouji | B21D 22/02 |
| 2022/0213589 | A1* | 7/2022 | Isaka | C23C 28/42 |
| 2024/0102144 | A1* | 3/2024 | Ebersold | C23C 14/0021 |

FOREIGN PATENT DOCUMENTS

| | | | | | |
|---|---|---|---|---|---|
| CN | 107747093 | A | | 3/2018 | |
| CN | 108950548 | A | * | 12/2018 | C23C 14/022 |
| CN | 111020497 | A | | 4/2020 | |
| CN | 111183269 | A | | 5/2020 | |
| CN | 111945111 | A | * | 11/2020 | C23C 14/0021 |
| DE | 102010052687 | A1 | * | 5/2012 | C23C 28/042 |
| EP | 1918422 | B1 | * | 3/2014 | C23C 28/00 |
| EP | 2986752 | B1 | | 4/2021 | |
| JP | 2002103691 | A | | 4/2002 | |
| JP | 2008-533310 | A | | 8/2008 | |
| JP | 2010115740 | A | * | 5/2010 | |
| JP | 2016520719 | A | | 7/2016 | |
| KR | 20050013079 | A | | 2/2005 | |
| TW | 200934895 | A | | 8/2009 | |
| WO | 2020/099605 | A1 | | 5/2020 | |

OTHER PUBLICATIONS

Machine translation of JP 2010115740 A.*
Machine translation of CN 111945111 A.*
Machine translation of DE 102010052687 A1.*
International Search Report dated May 24, 2022 and Written Opinion for PCT/EP2022/054519, filed Feb. 23, 2022.
First Examination Opinion Notice dated Jul. 17, 2025 for Chinese Application No. 202280016486.0.
International Preliminary Amendment dated Aug. 29, 2023, with Written Opinion for PCT/EP2022/054519.
Notice of Reasons for Rejection dated Nov. 11, 2025 for JP 2023-551110.
Second Examination Opinion Notice dated Nov. 25, 2025 for CN 202280016486.0.

* cited by examiner

COATING SYSTEM FOR PLASTIC PROCESSING APPLICATIONS

FIELD OF THE INVENTION

The present invention relates to a coating system for plastic processing applications.

BACKGROUND OF THE INVENTION

Plastic processing applications like injection molding or extrusion contains various stages where metal tools come in a physical contact with plastic. This causes the tool, e.g. injection molds, to suffer from a combined corrosive and abrasive attack. Corrosive media induced by plastics can be originated from e.g. softener, colors, and free hydrochloric acid used in plastics. At the same time, the increasing interest in use of glass fiber reinforced plastics in different plastic processing applications, e.g. injection molding produced parts for automotive industry, has led to more abrasive wear on tools. Glass fiber reinforced plastics with a glass fiber content of >30% are extremely abrasive and reduce the tool life.

For the purpose of extending the lifetime of tools used in plastic processing applications, PVD coatings combining abrasive wear resistance and corrosion resistance are required.

Bolvardi proposes in the document WO2020099605 a coating system to meet the requirements of plastic processing applications, the coating system comprising:

- an under layer comprising at least one corrosion resistant material layer, preferably one or more AlCrO layers as corrosion resistant layers,
- an upper layer comprising one or more abrasion resistant material layers, preferably one or more CrON layers as abrasion resistant layers, and
- a transition layer provided between the first layer and the second layer.

Bolvardi mentions furthermore in the document WO2020099605 that a multilayer coating of the type . . . CrN/CrON/CrN/CrON . . . only provides a good abrasion resistance but a poor corrosion resistance.

In despite of the advances attained by the prior art, the increased demand on further improvements for attaining the required tool performance during plastic processing applications in a sustainable manner makes necessary to work on further coating solutions for meeting these increased demands.

OBJECTIVE OF THE PRESENT INVENTION

The objective of the present invention is to provide a coating system produced in a sustainable manner for attaining a good combination of corrosion resistance and abrasion resistance that can be suitable for enhancing performance of tools used in plastic processing applications.

A further objective of the present invention is to provide a forming tool having a surface to be exposed to contact with plastic during plastic processing applications, said surface being treated and/or coated previous to use (previous to be used in any plastic processing applications) in such a manner that it exhibits a suitable combination of good abrasion resistance and good corrosion resistance during the use.

DESCRIPTION OF THE PRESENT INVENTION

The objective of the present invention is attained by providing a multilayer coating comprising a plurality of layers deposited one on each other, wherein:

- individual chromium nitride based (CrN-based) layers or individual chromium nitride (CrN) layers, and
- individual chromium oxynitride based (CrON-based) layers or individual chromium oxynitride (CrON) layers
- are deposited one on each other forming a sequence of the type . . . CrN/CrON/CrN/CrON/CrN . . . , and wherein the ratio between the layer thicknesses of two layers deposited one on each other is modulated along the thickness of the multilayer coating.

For simplifying the description of the invention, the individual CrN-based layers or individual CrN layers will be referred as to A layers and the individual CrON-based layers or individual CrON layers will be referred as to B layers.

The wording "the ratio between the layer thicknesses of two layers deposited one on each other is modulated along the thickness of the multilayer coating" refers to a specific variation of the ratio between the layer thicknesses of two individual layers, i.e. one A layer and one B layer, when the one A layer is deposited on the one B layer.

Since the thickness of the individual layers (A layer or B layer) can lightly vary because light intrinsic variations in the coating conditions during coating deposition in despite of setting the same coating process parameters, then thickness of the individual layers (A layers or B layers) should be understood as an average layer thickness of the individual layers (A layers or B layers).

The inventor found that surprisingly with a multilayer coating of the type . . . A/B/A/B/A . . . , with layers A and layers B as defined above:

- the corrosion resistance of the multilayer coating can be enhanced by adjusting the thickness of the A layers in relation to the thickness of the B layers in a way that the average thickness of the A layers is thicker in comparison with the average thickness of the B layers,
- the abrasive wear resistance of the multilayer coating can similarly be improved but by adjusting the thickness of the A layers in relation to the thickness of the B layers in a way that the average thickness of the A layers is thinner in comparison with the average thickness of the B layers, and
- both the abrasive wear resistance and the corrosion wear resistance of the multilayer coating can be improved by depositing the multilayer coating with modulated ratio of the thicknesses of the A layers and B layers, in a manner that the multilayer coating comprises at least two different coating portions along the whole multilayer coating thickness, with differently adjusted ratio of the thicknesses of the A layers and B layers, in particular the multilayer coating should comprise:
  - an under multilayer coating portion in which the average thickness of the A layers is thicker than the average thickness of the B layers, and
  - an upper multilayer coating portion in which the average thickness of the A layers is thinner than the average thickness of the B layers,
  - wherein when the multilayer coating is deposited in a substrate surface, preferably the under multilayer coating portion is deposited closer to the substrate surface than the upper multilayer coating portion.

In the context of the present invention a CrN-based layer or CrN layer (also referred to as A layer in the context of the present invention) is a chromium nitride layer which might comprises other chemical elements as doping elements or alloying elements.

Such a layer can have for example an average chemical composition given by the following formula:

$$(Cr_aX_b)_q(N_dZ_e)_r$$

wherein a, b, d and e are the coefficients representing the percentage in atomic concentration of Cr, X, N and Z, respectively, q and r are the coefficients indicating the stoichiometry (r/q=1) or hyper-stoichiometry (r/q>1) or sub-stoichiometry (r/q<1), and wherein:

- Cr is the chemical element chromium
- N is the chemical element nitrogen
- X is one or more chemical elements selected from: Ti, Zr, Hf, Sc, Y, V, Nb, Ta, In, Si, Ge, Sn, Al, Mo, W, Ni, Pd, Pt, Cu, Ag, Au, B,
- Z is one or more chemical elements selected from: carbon (C) and oxygen (O), wherein if X is O or if X comprises O, then the concentration of O in atomic percentage in the sum of N+Z should not be higher than 5 in atomic percentage. It means concretely that for example, if X=0, then e can be maximal 5, i.e. if X=O, then 0≤e≤5
- a+b=100, with 0≤b≤20, preferably with 0≤b≤15, more preferably with 0≤b≤10 or 0≤b≤5
- d+e=100, with 0≤e≤30, preferably with 0≤e≤20, more preferably with 0≤e≤10 or 0≤e≤5
- 0.90<r/q°≤1.10

In the context of the present invention a CrON layer is a chromium oxynitride layer which might comprises other chemical elements as doping elements or alloying elements. Such a layer can have for example an average chemical composition given by the following formula:

$$(Cr_fD_t)_g(O_hN_jC_m)_u$$

wherein f, t, h, j and m are the coefficients representing the percentage in atomic concentration of Cr, D, O, N and Q, respectively, g and u are the coefficients indicating the stoichiometry (u/g=1) or hyper-stoichiometry (u/g>1) or sub-stoichiometry (u/g<1), and wherein:

- Cr is the chemical element chromium
- N is the chemical element nitrogen
- D is one or more chemical elements selected from: Ti, Zr, Hf, Sc, Y, V, Nb, Ta, In, Si, Ge, Sn, Al, Mo, W, Ni, Pd, Pt, Cu, Ag, Au, B,
- C is the chemical element carbon (C),
- f+t=100, with 0≤t≤20, preferably with 0≤t≤15, more preferably with 0≤t≤10 or 0≤t≤5
- h+j+m=100, with 5<j≤70, preferably with 5<j≤60, more preferably with 10≤j≤60 or 10<j<55, and with 0≤m≤15, preferably with 0≤e≤10.
- 0.90<r/q°<1.10

In other words, the average layer thicknesses ratio, LTR, is defined by the formula:

$$LTR = \frac{\text{average } A \text{ layer thickness}}{\text{average } B \text{ layer thickness}}$$

BRIEF DESCRIPTION OF THE DRAWINGS

In order to explain the invention in more detail, following Figures will be used.

DETAILED DESCRIPTION

Figure 1:
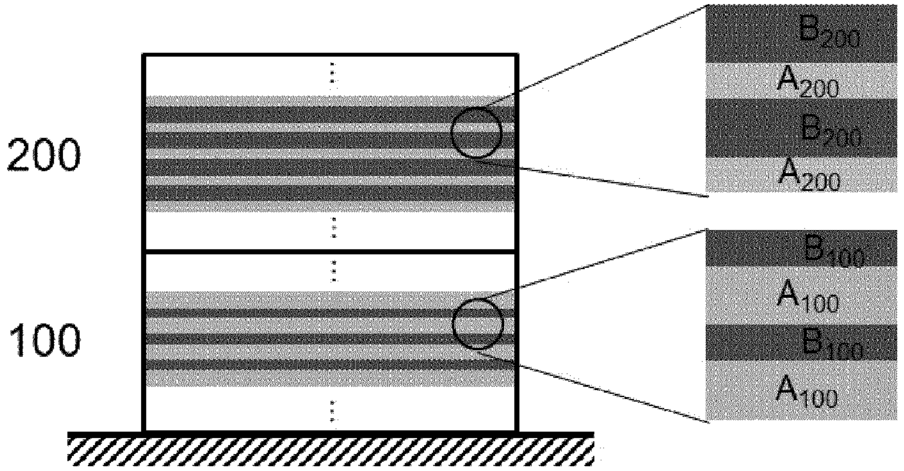
FIGS. 1 and 2 schematic representation of coating designs, including an under multilayer coating portion 100 and an upper multilayer coating portion 200—A layers in bright grey, B layers in dark grey.
Figure 2:
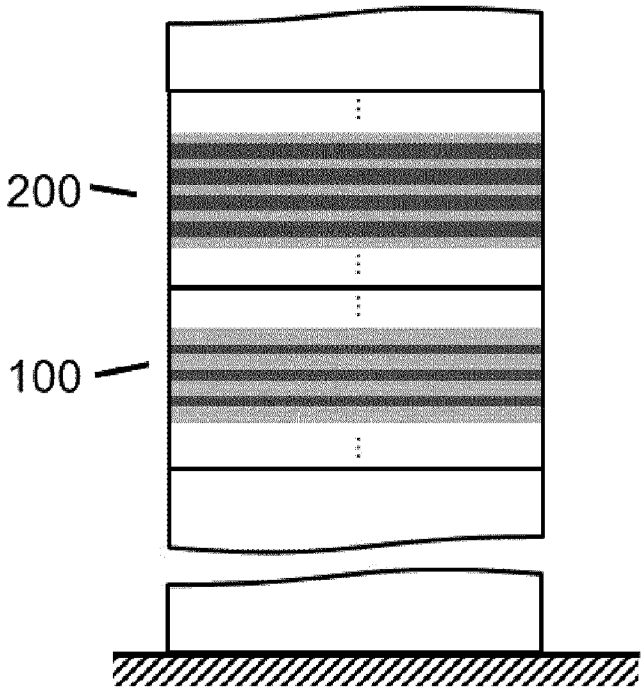
Figure 3:
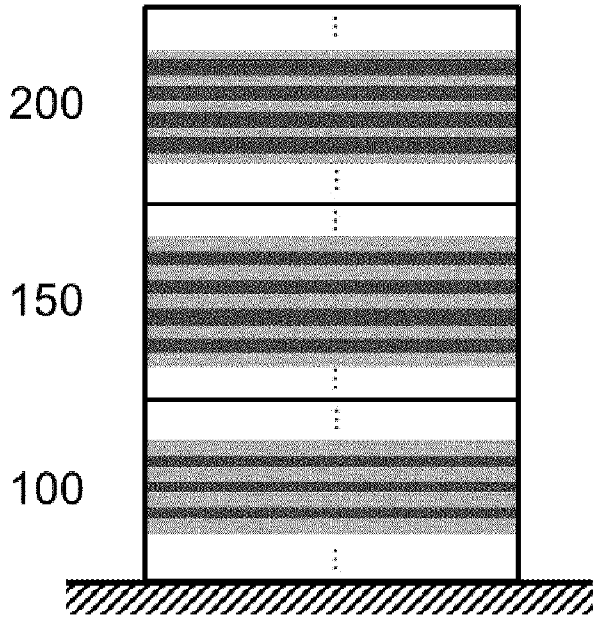
FIGS. 3 and 4 schematic representation of coating designs, including an under multilayer coating portion 100, and intermediate multilayer coating portion 150 and an upper multilayer coating portion 200—A layers in bright grey, B layers in dark grey.
Figure 4:
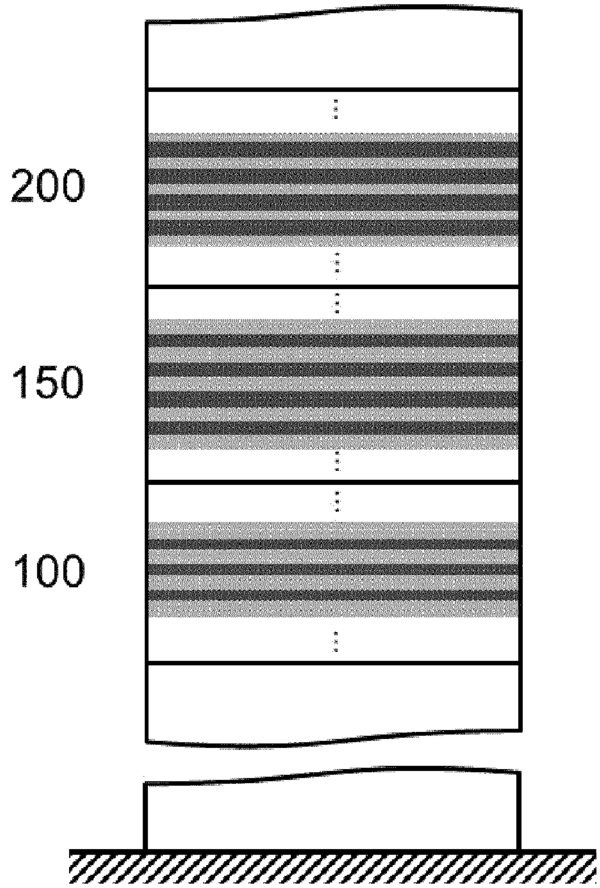

Hence, in an under multilayer coating portion 100, the average layer thickness ratio, LTR100, is given by considering the average layer thickness of the A layers in the under multilayer coating portion 100, i.e. the average layer thickness of the A100 layers, and the average layer thickness of the B layers in the under multilayer coating portion 100, i.e. average layer thickness of the B100 layers:

$$LTR100 = \frac{\text{average thickness of } A100}{\text{average thickness of } B100}$$

And similarly, in an upper multilayer coating portion 200, the average layer thickness ratio, LTR200, is given by considering the average layer thickness of the A layers in the upper multilayer coating portion 200, i.e. the average layer thickness of the A200 layers, and the average layer thickness of the B layers in the upper multilayer coating portion 200, i.e. average layer thickness of the B200 layers:

$$LTR200 = \frac{\text{average thickness of } A200}{\text{average thickness of } B200}$$

The inventor observed an important improvement in the combination of corrosion resistance and abrasion resistance, when a multilayer coating with at least two multilayer coating portions was produced, in a manner that the average layer thickness ratio LTR100 in the under multilayer coating portion 100 was greater than the average layer thickness ratio LTR200 in the upper multilayer coating portion 200, i.e. when LTR100>LTR200.

In particular, a surprisingly good combination of high corrosion resistance and high abrasion resistance was obtained in a preferred embodiment of the present invention, in which the multilayer coating was produced with at least two multilayer coating portions, an under multilayer coating portion 100 having average layer thickness ratio LTR100>1 and an upper multilayer coating portion 200 having average layer thickness ratio LTR200<1.

A multilayer coating according to the present invention can also comprise further coating portions or further coating layers.

According to a further preferred embodiment of the present invention the multilayer coating comprises an intermediate multilayer coating portion 150 deposited between the under multilayer coating portion 100 and the upper multilayer coating portion 200.

The intermediate multilayer coating portion 150, having an average layer thickness ratio, LTR150, given by considering the average layer thickness of the A layers in the intermediate multilayer coating portion 150, i.e. the average layer thickness of the A150 layers, and the average layer thickness of the B layers in the intermediate multilayer coating portion 150, i.e. average layer thickness of the B150 layers:

$$LTR150 = \frac{\text{average thickness of } A150}{\text{average thickness of } B150}$$

wherein LTR100>LTR150>LTR200

According to one more further preferred embodiment, the multilayer coating comprises more than three multilayer coating portions, wherein the first multilayer coating portion is the under multilayer coating portion 100 and the last multilayer coating portion is the upper multilayer coating portion 200, wherein each multilayer coating portion has a different average layer thickness ratio LTR and the LTR decreases gradually (continuously or stepwise) from the under multilayer coating portion up to the upper multilayer coating portion.

Preferably, the layers of CrN within one coating portion have approximately the same coating thickness, and preferably the layers of CrON within one coating portion have approximately the same coating thickness. Variations can occur for instance though due to substrate rotation and relative orientation of the deposition sources in the PVD deposition system.

Preferably the thickness of one bilayer, i.e. the thickness of the sum of one B layer plus one A layer deposited one on the other is in a range of 30 nm to 500 nm, more preferably in a range of 100 nm to 200 nm, for example the bilayer thickness can be 150 nm.

The total multilayer coating thickness is preferably between 1 μm and 30 μm, more preferably between 2 μm and 20 μm, still more preferably between 5 and 10 μm.

The thickness of one multilayer coating portion, e.g. the thickness of the under multilayer coating portion 100 or the thickness of the upper multilayer coating portion 200 is preferably not lower than 10% of the total multilayer coating thickness.

Preferably, the coating comprise a cubic fcc-CrN phase. This can for example be characterized by X-ray diffraction.

The coating has preferably an indentation hardness larger than 20 GPa, in particular in the range 25-35 GPa.

The coating according to the present invention can also comprise a bottom coating layer, which is deposited between the substrate surface on which the multilayer coating is deposited and the under multilayer coating portion.

The bottom coating layer can be for example be deposited directly on the substrate surface for improving adhesion of the coating to the substrate surface. In this case, the bottom coating layer can be for example a CrN layer or a Cr layer or can be a layer comprising any of CrN or Cr.

The coating according to the present invention can also comprise a top coating layer, which is deposited atop the coating, above the upper multilayer coating portion.

The top coating layer can be for example be deposited as outermost layer directly on the upper multilayer coating portion for improving any further surface properties.

The top coating layer can be for example a CrON layer for reducing tendency to stick to plastic materials.

Application of the described coatings can be combined with nitriding pre-treatment. This can be done either in a separate vacuum or atmospheric nitriding process, or in-situ prior to application of the first surface layer.

The inventive coatings can be deposited by using known PVD techniques.

The use of a negative bias voltage applied to the substrate during deposition of the multilayer coating portions was found to be advantageous, for example a negative bias voltage between 10 V and 150 V (in absolute value).

INVENTIVE EXAMPLES AND COMPARATIVE EXAMPLES

The present description including Figures and examples are not provided with the intention to limit the invention but only to help to understand the invention. Therefore, the examples given in the present description should not be understood as a limitation of the invention.

For the deposition of the inventive coatings as well as for the deposition of the comparative coatings described in the examples below, an Oerlikon Balzers INNOVENTA mega PVD deposition system was used.

The examples of inventive coatings as presented below were deposited through arc deposition from Cr-targets. The multilayer architecture was obtained through alternating pure N2 atmosphere for deposition of CrN, and an atmosphere of a mixture between N2 and O2. Several sequences of pure N2 atmosphere, followed by mixed N2/O2 atmosphere were repeated to obtain coatings with a sequence of several bilayer periods consisting of CrN and CrON individual layers.

The thickness ratio between CrN and CrON layers was modulated (i.e. controlled) by adjusting the time duration of the deposition sequence in pure N2 atmosphere and the time in mixed N2/O2 atmosphere.

Figure 5:
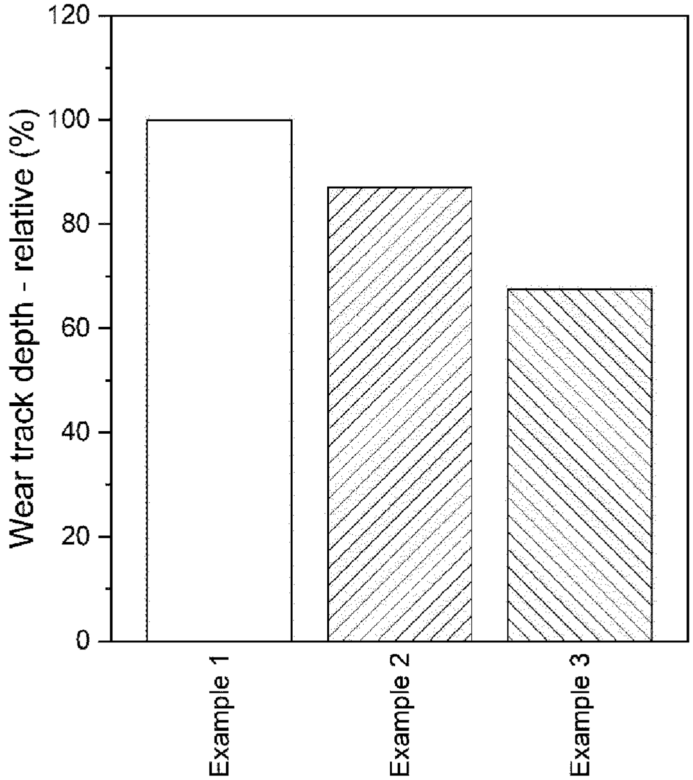
FIG. 5 Wear track depth after SRV measurement to evaluate abrasive wear resistance. Less abrasive wear corresponds to lower wear track depth, i.e. the lower height of the bar, the higher the abrasive wear resistance. The values are normalized relative to the results corresponding to Example. Examples 1 is an comparative example, Examples 2 and 3 are inventive examples.
Figure 6:
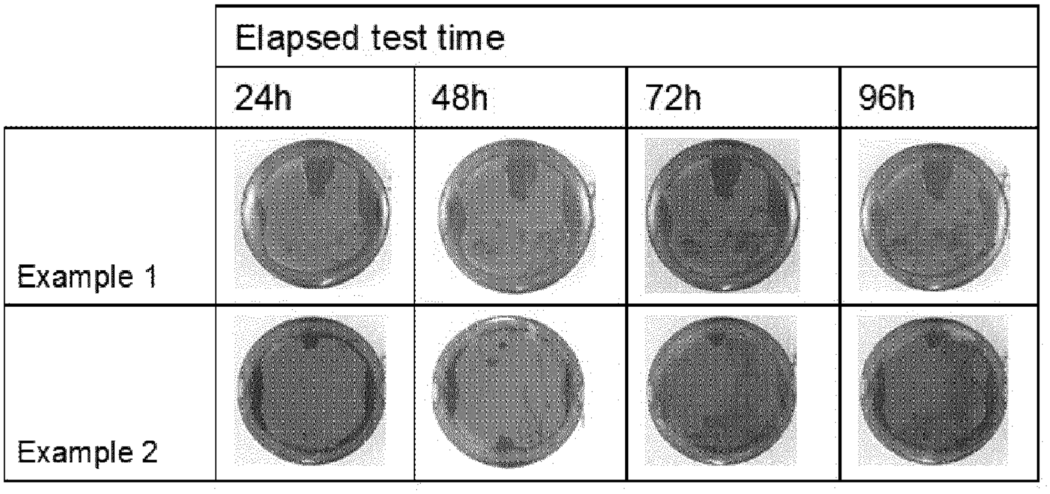
FIG. 6 Steel samples documented after different elapsed time in NSST test.

In the FIGS. 5 and 6 are shown the results regarding corrosion resistance test and abrasion resistance test conducted in substrates coated with a comparative example according to Example 1 and two comparative examples according to Example 2 and Example 3.

Comparative Examples 1

A multilayer coating comprising CrN layers and CrON layers with average layer thickness ratio LTR=1, i.e. with average layer thickness of the individual CrN layers in the same magnitude (same average thickness layer value) as the individual CrON layers was deposited and tested. For some of the tests, in particular for the tests shown in FIGS. 5 and 6 a bottom layer of CrN was deposited between the substrate surface and the multilayer coating.

Inventive Examples 2

Different inventive multilayer coatings comprising A layers of the type CrN layers and B layers of the type CrON layers, the multilayer coatings formed by two different multilayer coating portions, an under multilayer coating portion having LTR between 2 and 1.3 and an upper multilayer coating portion with LTR between 0.8 and 0.3 were deposited and tested. For some of the tests, in particular for the tests shown in FIGS. 5 and 6 a bottom layer of CrN was deposited between the substrate surface and the multilayer coating. For the tests shown in FIGS. 5 and 6, LTR in the under multilayer coating portion was between 1.55 and 1.75, and LTR in the upper multilayer coating portion was between 0.4 and 0.7.

Inventive Examples 3

The only difference between Example 2 and 3 was that the multilayer coatings were deposited with an additional multilayer coating portion, more exactly an intermediate multilayer coating portion with LTR between 1.2 and 0.9. For the tests shown in FIGS. 5 and 6, LTR in the intermediate multilayer coating portion was about 1.

Description of the Tests:

Abrasive wear resistance of the coatings was investigated using sliding reciprocal wear (SRV) measurements. A ball made of Al2O3 was used in reciprocal sliding motion, with 10 Hz under constant applied force (50 N) and for 60 min. The depth of the resulting wear track was measured and is presented in FIG. 5. A low wear track depth correspond to high abrasive wear resistance. As can be seen in FIG. 5, the inventive coatings (see Examples 2 and 3 in FIG. 5) display higher abrasive wear resistance than the comparative coating (see Example 1 in FIG. 5) produced according to the prior-art.

In order to evaluate the corrosion resistance of the coatings, the inventive coatings and the comparative coatings produced according to the prior-art were tested using a neutral salt spray test (NSST). The coatings were applied to a substrate made of 1.2842 cold work steel with 0.4 at % Cr. As exemplified in FIG. 6, the comparative coating (see Example 1 in FIG. 6) shows pitting corrosion on a main part of the surface after 72-96 hours. With the inventive coating (see Example 2 in FIG. 6), good corrosion resistance was attained.

These two tests confirm that the inventive coatings combine good corrosion resistance and high abrasive wear resistance.

The invention claimed is:

1. A coated substrate comprising a substrate and a multilayer coating, the multilayer coating comprising layers A and layers B deposited to form a periodic multilayer structure comprising an alternating sequence of layers A and layers B (A/B/A/B/ . . . ), the layers A being CrN-based layers or CrN layers and the layers B being CrON-based layers or CrON layers, wherein the multilayer coating has at least two different multilayer coating portions, each multilayer coating portion has a respective ratio (LTR) of an arithmetic mean thickness of all layers A contained in said each multilayer coating portion to an arithmetic mean thickness of all layers B contained in said each multilayer coating portion, and wherein respective LTR values of different multilayer coating portions differ, wherein:

the multilayer coating portions comprise:

an under multilayer coating portion with an average thickness ratio LTR100, defined as a ratio of an arithmetic mean thickness of all the layers A in the under multilayer coating portion to an arithmetic mean thickness of all the layers B in the under multilayer coating portion, and an upper multilayer coating portion with an average thickness ratio LTR200 defined as a ratio of an arithmetic mean thickness of all the layers A in the upper multilayer coating portion to an arithmetic mean thickness of all the layers B in the upper multilayer coating portion, wherein LTR100>LTR200, and wherein any first layer A has a respective thickness greater than or equal that of any second layer A located more distal to the substrate than said first layer A, and any first layer B has a respective thickness less than or equal that of any second layer B located more distal to the substrate than the first layer B.

2. A coated substrate comprising a substrate and a multilayer coating, the multilayer coating comprising layers A and layers B deposited to form a periodic multilayer structure comprising an alternating sequence of layers A and layers B (A/B/A/B/ . . . ), the layers A being CrN-based layers or CrN layers and the layers B being CrON-based layers or CrON layers, wherein the multilayer coating has at least two different multilayer coating portions, each multilayer coating portion has a respective ratio (LTR) of an arithmetic mean thickness of all layers A contained in said each multilayer coating portion to an arithmetic mean thickness of all layers B contained in said each multilayer coating portion, and wherein respective LTR values of different multilayer coating portions differ, wherein:

the multilayer coating portions comprise:

an under multilayer coating portion with an average thickness ratio LTR100, defined as a ratio of an arithmetic mean thickness of all the layers A in the under multilayer coating portion to an arithmetic mean thickness of all the layers B in the under multilayer coating portion, and an upper multilayer coating portion with an average thickness ratio LTR200 defined as a ratio of an arithmetic mean thickness of all the layers A in the upper multilayer coating portion to an arithmetic mean thickness of all the layers B in the upper multilayer coating portion, wherein LTR100>1 and LTR200<1, and wherein the under multilayer coating portion is deposited closer to the substrate than the upper multilayer coating portion is.

3. A multilayer coating with layers A and layers B deposited to form a periodic multilayer structure comprising an alternating sequence of layers A and layers B (A/B/A/B/ . . . ), the layers A being CrN-based layers or CrN layers and the layers B being CrON-based layers or CrON layers, wherein the multilayer coating has at least two different multilayer coating portions, each multilayer coating portion has a respective ratio (LTR) of an arithmetic mean thickness of all layers A contained in said each multilayer coating portion to an arithmetic mean thickness of all layers B contained in said each multilayer coating portion, and wherein respective LTR values of different multilayer coating portions differ, wherein:

the multilayer coating portions comprise:

an under multilayer coating portion with an average thickness ratio LTR100, defined as a ratio of an arithmetic mean thickness of all the layers A in the under multilayer coating portion to an arithmetic mean thickness of all the layers B in the under multilayer coating portion, an upper multilayer coating portion with an average thickness ratio LTR200 defined as the ratio of an arithmetic mean thickness of all the layers A in the upper multilayer coating portion to an arithmetic mean thickness of all the layers B in the upper multilayer coating portion, wherein LTR100>LTR200, and an intermediate multilayer coating portion deposited between the under multilayer coating portion and the upper multilayer coating portion.

4. The multilayer coating according to claim 3, wherein the intermediate multilayer coating portion has an average thickness ratio LTR150, defined as a ratio of an arithmetic mean thickness of all the layers A in the intermediate multilayer coating portion to an arithmetic mean thickness of all the layers B in the intermediate multilayer coating portion, wherein LTR100>LTR150>LTR200.

* * * * *